United States Patent
Venkataraman et al.

(10) Patent No.: US 11,461,035 B2
(45) Date of Patent: Oct. 4, 2022

(54) ADJUSTING A PREPROGRAM VOLTAGE BASED ON USE OF A MEMORY DEVICE

(71) Applicant: Micron Technology, Inc., Boise, ID (US)

(72) Inventors: Priya Venkataraman, Boise, ID (US);
Pitamber Shukla, Boise, ID (US);
Scott A. Stoller, Boise, ID (US);
Giuseppina Puzzilli, Boise, ID (US);
Niccolo' Righetti, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/127,373

(22) Filed: Dec. 18, 2020

(65) Prior Publication Data
US 2022/0197536 A1 Jun. 23, 2022

(51) Int. Cl.
*G06F 3/06* (2006.01)

(52) U.S. Cl.
CPC .......... *G06F 3/0652* (2013.01); *G06F 3/0625* (2013.01); *G06F 3/0679* (2013.01)

(58) Field of Classification Search
CPC ..... G06F 3/0679; G06F 3/0625; G06F 3/0652
USPC ................................................... 711/154, 103
See application file for complete search history.

(56) References Cited

U.S. PATENT DOCUMENTS

| | | | | |
|---|---|---|---|---|
| 2010/0067306 A1* | 3/2010 | Hwang | ................. | G11C 16/30 365/185.19 |
| 2011/0051521 A1* | 3/2011 | Levy | ..................... | G11C 16/10 365/185.24 |
| 2014/0297924 A1* | 10/2014 | Sanda | .................... | G11C 16/16 711/103 |
| 2017/0062059 A1* | 3/2017 | Kim | ..................... | G11C 16/107 |
| 2021/0183448 A1* | 6/2021 | Shin | ................... | G11C 13/0064 |

* cited by examiner

*Primary Examiner* — Hashem Farrokh
(74) *Attorney, Agent, or Firm* — Nicholson DeVos Webster & Elliott LLP

(57) ABSTRACT

A method is described that includes determining a number of program and erase cycles associated with a block of pages of a memory device and determining a preprogram voltage based on the number of program and erase cycles to apply to the block of pages prior to an erase operation. The method further includes applying the preprogram voltage to the block of pages and performing an erase operation on the block of pages following application of the preprogram voltage to the block of pages.

14 Claims, 6 Drawing Sheets

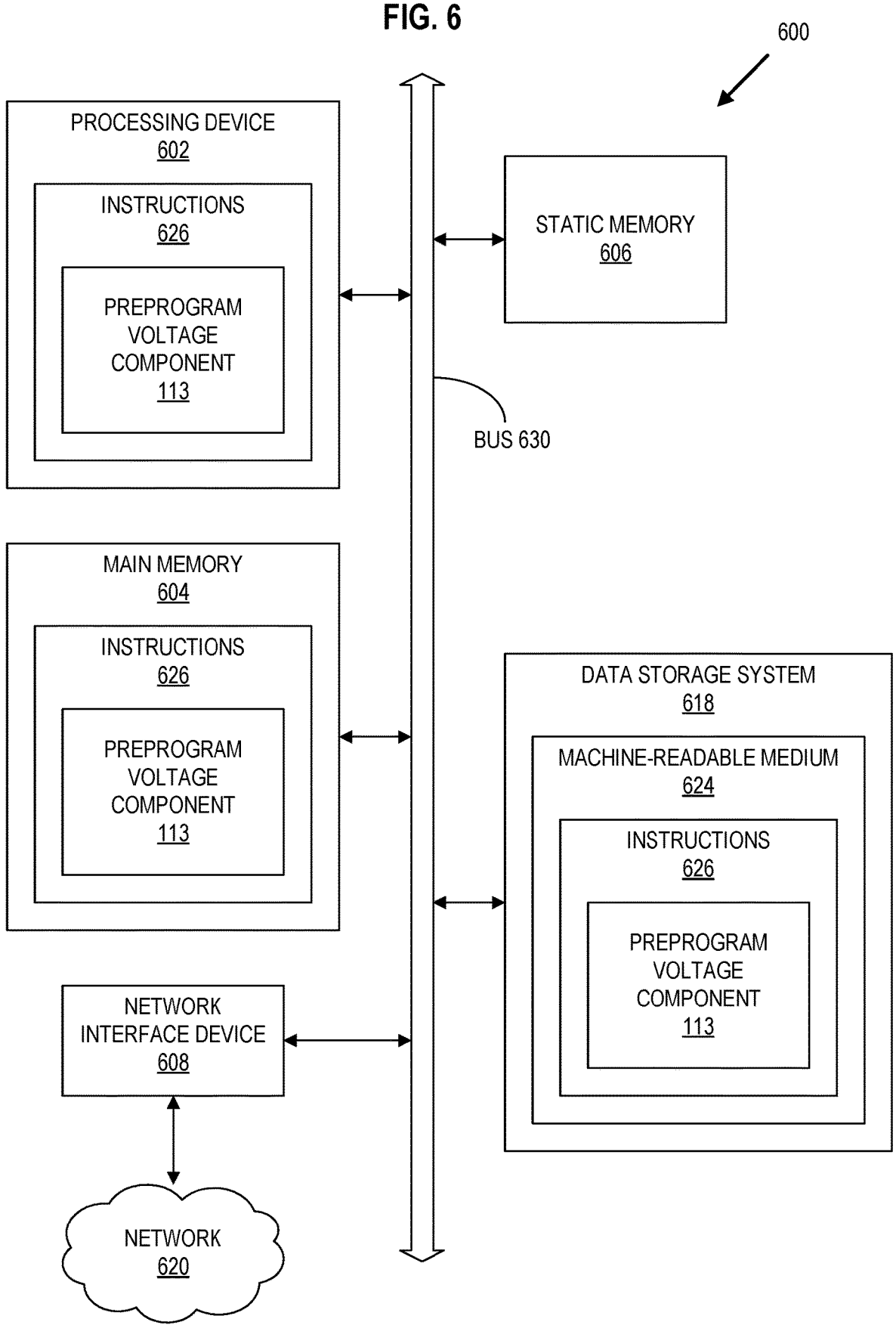

ADJUSTING A PREPROGRAM VOLTAGE BASED ON USE OF A MEMORY DEVICE

TECHNICAL FIELD

The present disclosure generally relates to adjusting a preprogram voltage, and more specifically, relates to adjusting a preprogram voltage based on use of a memory device.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 6 is a block diagram of an example computer system in which embodiments of the present disclosure may operate.

DETAILED DESCRIPTION

Figure 1:
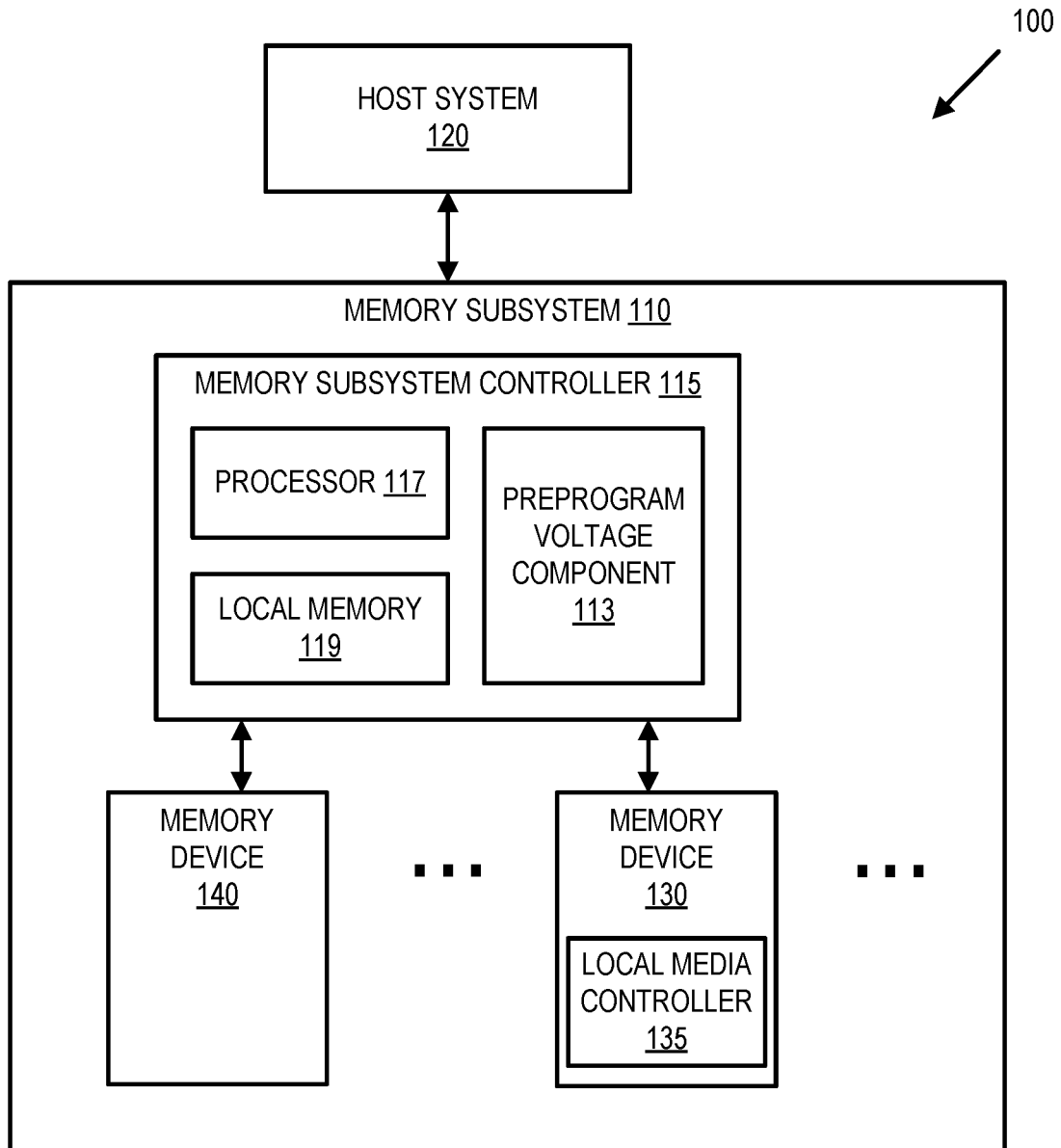
FIG. 1 illustrates an example computing system that includes a memory subsystem in accordance with some embodiments of the present disclosure.

Aspects of the present disclosure are directed to determining a preprogram voltage for applying to a block of pages in a memory device based on one or more of (1) a number of program and erase operations/cycles applied to the block of pages and (2) a number of pages programmed/written in the block (e.g., a last written page in the block of pages) in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

A NAND memory device includes strings of transistors connected in series. For example, a NAND memory device can include 148,000 strings of transistors. Each string of transistors shares a common power source with an associated ground and a capacitor coupled between the power source and the series of transistors. Transistors from each string of transistors are grouped together to form a page of transistors (sometimes referred to as "memory cells"). For example, in a NAND memory device with 148,000 strings of transistors and each string of transistors includes four transistors connected in series, the NAND memory device can include four pages of transistors (although other configurations are possible). In particular, each page includes 148,000 transistors with a single transistor being selected from each string of transistors for each page and sets of pages can be grouped into blocks and/or sub-blocks. Further, the transistors in each page of transistors share a control gate on which a voltage can be applied (e.g., an erase voltage). A memory subsystem controller can perform an erase operation on a set of pages in the NAND memory device to attempt to move each transistor/memory cell into an erase state (e.g., a voltage corresponding to a set/on state or logical state of "1"). In particular, the memory subsystem controller applies an erase voltage to transistors in a set/block of pages to cause those transistors to have a voltage that is below a threshold value. Following application of the erase voltage, the memory subsystem controller performs a verify operation to determine if the erase operation was successful. The verify operation is performed per string of transistors and includes (1) applying a verify voltage (e.g., 0 volts) to each page of transistors via control gates and (2) applying a current from a common power to each corresponding series of transistors. When the previous erase operation was successful and each of the transistors is in the erase/on state (i.e., the voltage of the transistor is below the verify voltage), the current will move/sink to the common ground of each string of transistors. This will result in a low voltage on the capacitor of the string, which is coupled between the power source and the series of transistors. Accordingly, a low voltage on this capacitor (e.g., below an erase verify voltage) will indicate a successful erase operation. However, when at least one of the transistors in a series of transistors fails to enter the erase/on state and the transistor is in the program/off state (e.g., a voltage above the erase verify voltage corresponding to a unset/off state or logical state of "0"), the current from the common power source will not be able to reach the common ground and will build up on the common capacitor, which results in a higher voltage on the common capacitor. Accordingly, a high voltage on this capacitor (e.g., above the threshold success value) will indicate an unsuccessful erase operation.

However, in some situations a capacitor with a voltage below the erase verify voltage can falsely indicate a successful erase operation for that string/series of transistors. In particular, when applying an erase voltage to a transistor that is already in an erase state (i.e., the voltage of the transistor is below the erase verify voltage), the voltage of the transistor will move deeper into an erase state (i.e., further below the erase verify voltage) such that the transistor is in a deep erase/on state. This deep erase/on state provides high conductivity on the string that will easily allow current to pass to the ground. Conversely, when applying an erase voltage to a transistor that is not yet in an erase state (i.e., the transistor is above the erase verify voltage such that the transistor is in a program/off state), the voltage of the transistor may be moved into a state in which the transistor is barely in the program/off state (i.e., the transistor is now barely above the erase verify voltage). Namely, if the erase verify voltage is 0 volts, such that a voltage on or below 0 volts is considered an erase/on state, the transistor may be at 0.1 volts after the erase operation (i.e., a shallow program/off state). This shallow program/off state can be the result of the transistor previously being in a deep program/off state and the erase voltage did not sufficiently move the voltage of the transistor to the erase/on state (i.e., below the erase verify voltage of 0 volts). Nevertheless, even though a transistor is in the program/off state (albeit a shallow program/off state), since the transistor is close to the erase/on state and since all of the other transistors in the string are providing high conduction on the string because they are in a deep erase state (i.e., transistors that were previously in an erase state before an erase operation and are now have been moved deep below the erase verify voltage), significant current from the common power source may still be able to pass/sink to the common ground. In this situation, in which there is a partial block erase (e.g., one or more pages in a block are not programmed) it can be useful to apply a preprogram voltage to the block of pages. In particular, when a partial block erase is detected or to avoid the situation entirely, the memory subsystem controller applies a preprogram voltage to each transistor in the block, which causes each transistor in the block to enter a program/off state. Thus, all of the transistors are starting in the same program/off state. Thereafter, an erase operation is performed on the block to attempt to move each of the transistors into an erase/on state. Since each of the transistors were in the same state, application of an erase voltage will move them each to the same or a very similar outcome. Namely, each of the transistors will either be in an erase state or in a program state with similar levels (e.g., shallow erase, deep erase, etc.) following application of an erase voltage. If the erase operation with the erase voltage was unsuccessful, the erase voltage can be increased and reapplied. In any case, the verify operation will provide a clear indication of success or failure as all of the transistors will be in the same or nearly the same state and a shallow erase condition or a erase variation in a partial block erase can be avoided while a partial block erase will have a similar erase depth compared to a full block erase.

In many cases, a memory subsystem controller sets the preprogram voltage to account for a worst-case scenario in which most transistors in a block are unprogrammed/erased. Accordingly, the memory subsystem controller applies a high preprogram voltage (e.g., 16 volts) to ensure that all transistors are in a deep program state prior to an erase. However, this high preprogram voltage introduces significant stress to the transistors, which reduces the lifetime of the transistors and results in poor performance (e.g., high error rate) and/or poor reliability (e.g., cross temperature performance). For example, this high preprogram voltage causes excessive wear as it results in increased/excessive movement of electrons across tunnel and/or channel layers of transistors (e.g., oxide layers) and consequent increased/excessive traps/imperfections in these layers. Increased traps/imperfections in the tunnel and/or channel layers reduces the lifetime of NAND memory devices and decreases reliability of the set of memory cells (e.g., cross-temperature performance). For instance, (1) programming memory cells under cold temperature conditions and reading the set of memory cells under hot temperature conditions and/or (2) programming memory cells under hot temperature conditions and reading the set of memory cells under cold temperature conditions can result in a significant movement of the voltage threshold of the memory cells when traps/imperfections are present in the channel layer, which results in higher bit error rates.

Aspects of the present disclosure address the above and other deficiencies by dynamically adjusting the preprogram voltage of a NAND memory device based on one or more factors, including factors associated with use of the NAND memory device. For example, a memory subsystem controller can adjust a preprogram voltage based on a number of program and erase cycles applied to a set of transistors in a NAND memory device. In particular, a NAND memory cell/transistor can be designed to withstand a combined number of program and erase operations before the NAND memory cell is considered end-of-life (sometimes referred to as "post-cycled") and may begin to fail (e.g., 3,000 to 10,000 program and erase cycles). At the beginning of life, the transistor requires a greater program voltage to be programmed. However, at the end of life, the transistor requires a smaller program voltage to be programmed. Accordingly, in one embodiment, the preprogram voltage can be set to a higher level at the beginning of life of a transistor to account for this greater preprogram requirement and a lower voltage as the life of the transistor progresses. Since this lower voltage is sufficient later in the life of the transistor, the preprogram voltage will program the transistor with reduced wear to the memory device in comparison to a higher preprogram voltage.

In another embodiment, the memory subsystem controller can adjust a preprogram voltage based on the last written page in the NAND memory device. In particular, as discussed above, transistors are arranged in strings within the NAND memory device and pages include transistors that span multiple strings. Accordingly, pages are stacked on these strings of transistors. In this configuration, to program any single page requires the programing of all preceding pages in the string. Since pages are programmed in order, the last programmed/written page in a NAND memory device indicates the number of pages that have been written in the NAND memory device. Further, the level of preprogram voltage needed to program pages is based on the number of pages and corresponding transistors already programmed. If many pages are programmed (i.e., the last preprogrammed/written page is large such that many pages have been written), then the number of deeply erased memory cells following an erase operation will be small such that the few erased memory transistor/cells will not significantly change the string current when verifying following an erase. In this a case, the preprogram voltage can be small. In contrast, if very few cells are programmed (i.e., the last preprogrammed/written page is small such that few pages have been written), then there are a large proportion of memory cells in the string that will remain deeply erased and have a large impact to increasing the string current during an erase verify. To compensate for this issue, a higher preprogram voltage is required.

Accordingly, as described above, a memory subsystem controller for a NAND memory device can dynamically adjust a preprogram voltage based on one or more of (1) a number of program and erase cycles/operations applied to transistors in the NAND memory device and (2) a last programmed/written page (i.e., a number of programmed/written pages) in the NAND memory device. By dynamically adjusting the preprogram voltage, less stress is applied to the NAND memory device by ensuring that (1) a more conservative preprogram voltage is used while still programming corresponding transistors to avoid a partial block erase condition prior to an erase operation and (2) in cases where blocks of the NAND memory device are nearly entirely written (i.e., the last programmed/written page is a large value), a more conservative preprogram voltage is used.

Although described in relation to NAND memory devices, the techniques and systems described herein can be utilized by any memory devices that utilize preprogram voltages. Additional details of these techniques and systems will be described in greater detail below.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a preprogram voltage component 113 that can determine a preprogram voltage for applying to a block of pages in a memory device (e.g., the memory device 130) based on one or more of (1) a number of program and erase operations/cycles applied to the block of pages and (2) a number of pages programmed/written in the block (e.g., a last written page in the block of pages). In some embodiments, the controller 115 includes at least a portion of the preprogram voltage component 113. For example, the controller 115 can include a processor 117 (processing device) configured to execute instructions stored in local memory 119 for performing the operations described herein. In some embodiments, a preprogram voltage component 113 is part of the host system 110, an application, or an operating system. Further details with regards to the operations of the preprogram voltage component 113 are described below.

Figure 2:
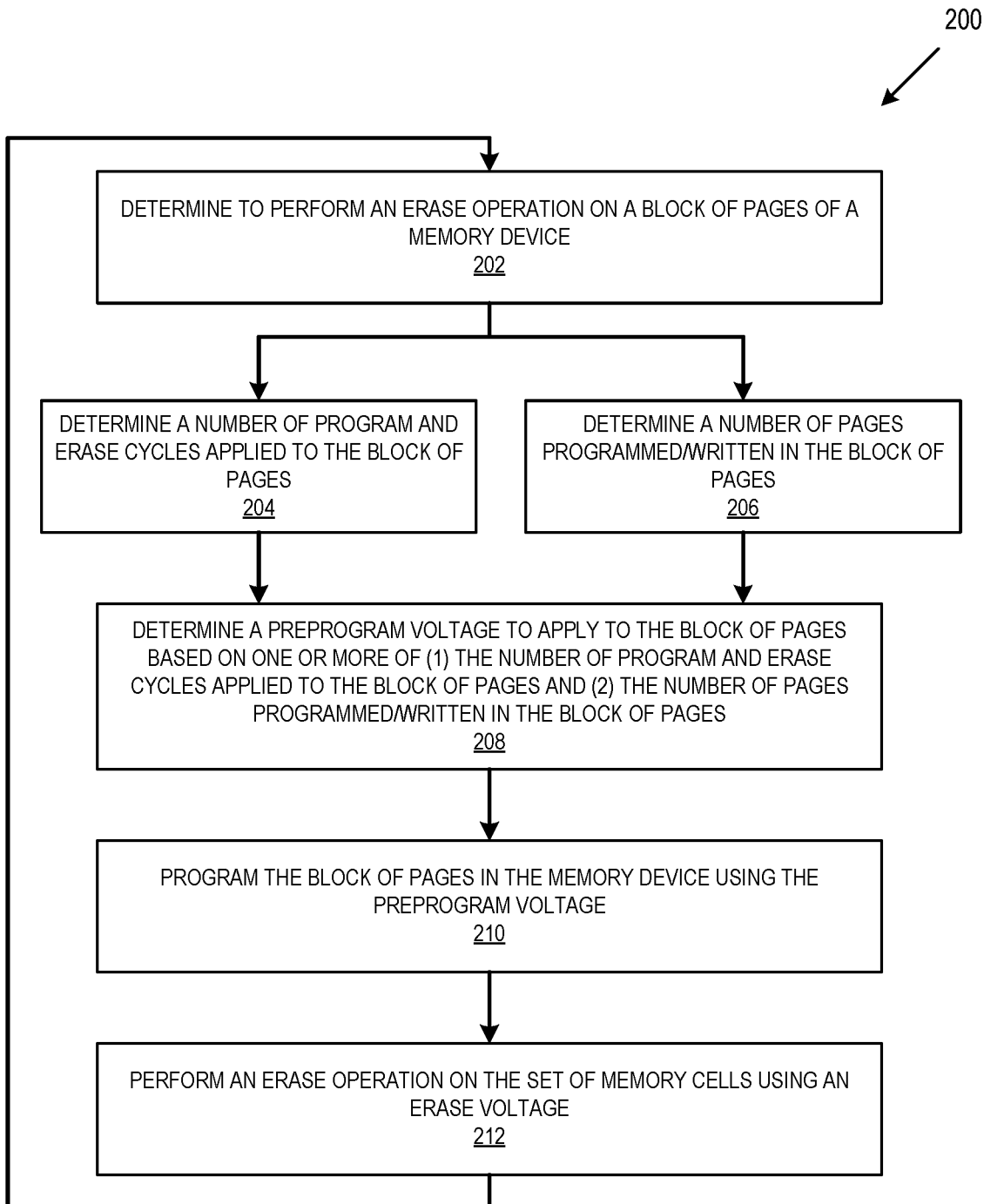
FIG. 2 is a flow diagram of an example method to determine a preprogram voltage for applying to a block of pages in a memory device, in accordance with some embodiments of the present disclosure.

FIG. 2 is a flow diagram of an example method 200 to determine a preprogram voltage for applying to a block of pages in a memory device (e.g., the memory device 130) based on one or more of (1) a number of program and erase operations/cycles applied to the block of pages and (2) a number of pages programmed/written in the block (e.g., a last written page in the block of pages), in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the preprogram voltage component 113 of FIG. 1. Although shown in a particular sequence or order, unless otherwise specified, the order of the processes/operations can be modified. Thus, the illustrated embodiments should be understood only as examples, and the illustrated processes/operations can be performed in a different order, and some processes/operations can be performed in parallel. Additionally, one or more processes/operations can be omitted in various embodiments. Thus, not all processes/operations are required in every embodiment. Other process flows are possible.

As shown in FIG. 2, the method 200 can commence at operation 202. At operation 202, the processing device determines that an erase operation is to be performed on a block of pages of a NAND memory device. For example, the processing device can determine that an erase operation is to be performed in response to (1) a request to delete data stored in the block of pages or (2) write data to the block of pages (e.g., the processing device is to delete the data currently stored in the block prior to new data being written to the block). As used herein, an erase operation attempts to change or ensure that the transistors/memory cells of the block of pages are in an erase state (e.g., an on/set state corresponding to a logical value of "1"). In one embodiment, the memory device can be the memory device 130. For example, the memory device 130 can be a NAND memory device that includes blocks of pages that will be erased. As used herein, a NAND memory device includes strings of transistors connected in series. For example, a NAND memory device can include 148,000 strings of transistors. Each string of transistors shares a common power source with an associated ground and a capacitor coupled between the power source and the series of transistors. Transistors from each string of transistors are grouped together to form a page of transistors. For example, in a NAND memory device with 148,000 strings of transistors and each string of transistors includes three-thousand transistors connected in series, the NAND memory device can include three-thousand pages of transistors. In particular, each page includes 148,000 transistors with a single transistor being selected from each string of transistors for each page and sets of pages can be grouped into blocks and/or sub-blocks.

As shown in FIG. 2, the processing device can perform one or more of operations 204 and 206 following operation 202. In some embodiments, operations 204 and 206 are performed in entirely or partially overlapping time periods while in other embodiments, the operations are performed sequentially (e.g., operation 204 is performed prior to operation 206 or operation 206 is performed prior to operation 204).

At operation 204, the processing device determines a number of program and erase cycles associated with the block of pages. For example, the memory subsystem controller 115 could have previously performed 1,000 program operations and 200 erase operations on a block of pages in the memory device 130. In this example, the processing device determines that 1,200 program and erase cycles have been performed in relation to the block of pages at operation 204. In some systems, an erase operation is required before a program operation can be performed. Accordingly, in these systems 1,000 program operations would result in 1,000 corresponding erase operations. In some embodiments, the processing device can determine that there have been 2,000 program and erase cycles based on this configuration (e.g., 1,000 program operations+1,000 erase operations). In other embodiments, the processing device can determine that there have been 1,000 program and erase cycles based on this configuration (e.g., 1,000 combined program and erase operations). In one embodiment, the memory subsystem 110 can maintain a set of data structures that indicate the number of program and erase operations that have been performed on each memory cell/transistor, each page of memory cells/transistors, and/or each block of pages. In some embodiments, the number of program and erase operations performed in relation to the block of pages can be (1) the actual number of program and erase operation collectively performed in relation to all of the memory cells/transistors in the block of pages or (2) the average number of program and erase operations that have been performed in relation to a group of memory cells/transistors (e.g., a page, a sub-block, a block, or all the memory cells/transistors in the memory device 130).

At operation 206, the processing device determines a number of pages that have been programmed/written in the block of pages (i.e., a number of pages that are currently programmed/written with the logical value of "0"). As discussed above, transistors are arranged in strings within NAND memory devices and pages include transistors that span multiple strings. Accordingly, pages are stacked on these strings of transistors. In an embodiment of this configuration, to program any single page requires that all preceding pages in the string are already programmed. Since pages are programmed in order, the last programmed/written page in a NAND memory device indicates the number of pages that are already written in the NAND memory device. Accordingly, the processing device can determine a number of pages written in the block of pages by determining a last programmed/written page in the NAND memory device. In one embodiment, the memory subsystem 110 can maintain a set of data structures that indicate a last programmed/written page (e.g., a number of pages that are currently programmed/written in the block of pages).

Figure 3:
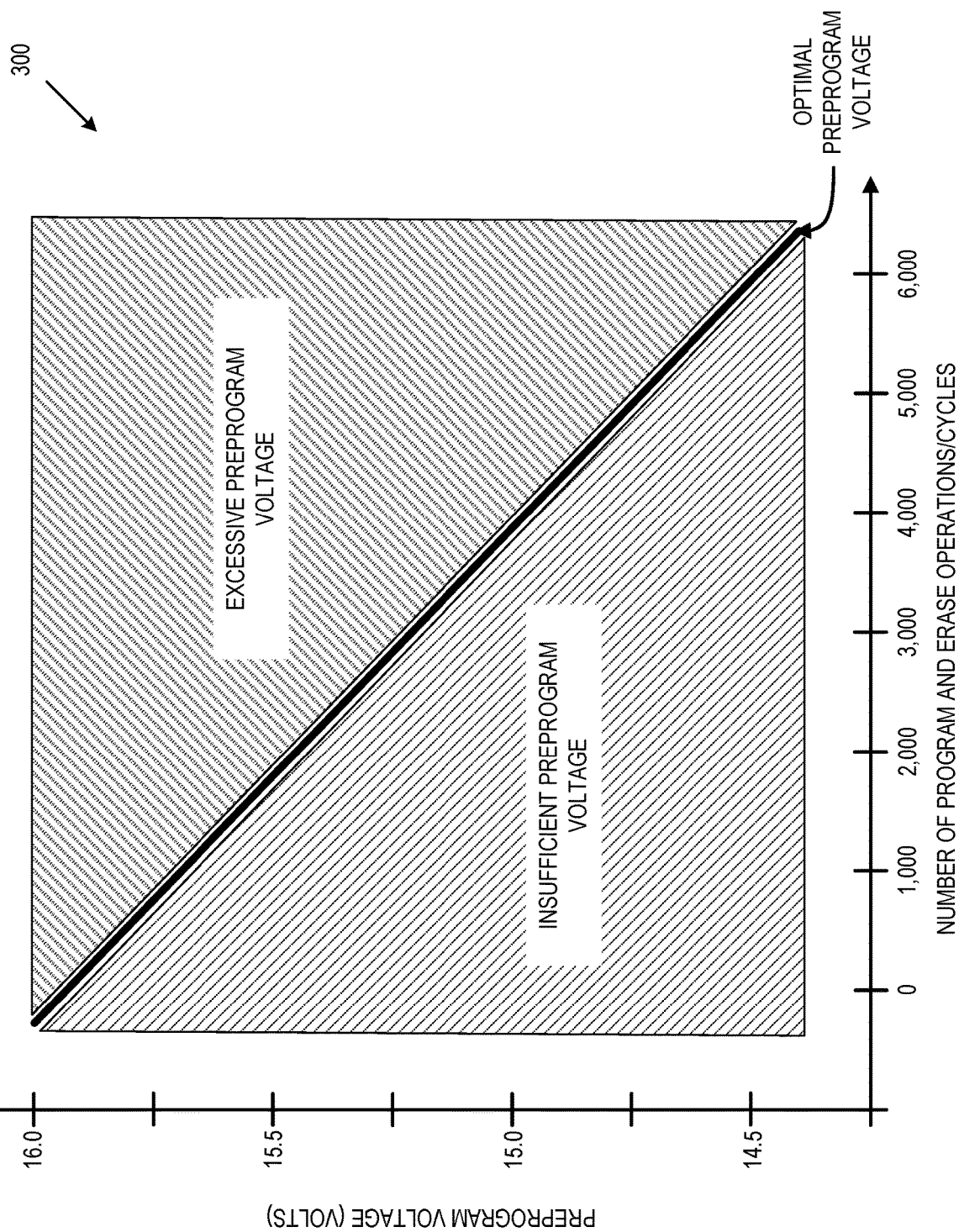
FIG. 3 shows a graph that demonstrates a preprogram voltage in relation to a number of program and erase operations/cycles applied to a block of pages, in accordance with some embodiments of the present disclosure.

At operation 208, the processing device determines a preprogram voltage to apply to the block of pages based on one or more of (1) the number of program and erase operations/cycles (as determined at operation 204) and (2) the number of pages programmed/written in the block of pages (as determined at operation 206). For example, a NAND memory cell/transistor can be designed to withstand a combined number of program and erase operations before the NAND memory cell is considered end-of-life and may begin to fail (e.g., 3,000 to 10,000 program and erase cycles). At the beginning of life, the transistor requires a greater program voltage to be programmed. However, at the end of life, the transistor requires a smaller program voltage to be programmed. Accordingly, in one embodiment, the preprogram voltage can be set to a higher level at the beginning of life of a transistor to account for this greater preprogram requirement and a lower voltage as the life of the transistor progresses since this lower voltage is sufficient later in life for the transistor to be programmed and will result in reduced wear to the memory device (i.e., the preprogram voltage will gradually decrease from the beginning of life (BOL) to end of life (EOL) of the memory device). FIG. 3 shows a graph 300 that demonstrates an optimal preprogram voltage in relation to a number of program and erase operations/cycles applied to a block of pages. Although the graph includes specific values, for a preprogram voltage and a number of program and erase operations/cycles, these values are merely illustrative and other values are possible. As shown in FIG. 3, as the number of program and erase operations/cycles applied to a block of pages increases, the optimal preprogram voltage to program the block of pages decreases. In particular, the optimal preprogram voltage decreases at a particular ratio ($R_{ProgErase}$) as the number of program and erase operations/cycles applied to a block of pages increases. As shown in FIG. 3, at the beginning of life of a NAND memory device (i.e., no program and erase operations/cycles have been applied to the block of pages), the preprogram voltage can be at a default level of 16 volts. However, the optimal preprogram voltage decreases as the number of program and erase operations/cycles applied to a block of pages increases until the end of life of the NAND memory device (e.g., 6,000 program and erase operations/cycles). At this point, the default preprogram voltage of 16 volts can be decreased by 1.5 volts to 14.5 volts. This lower voltage is sufficient to program the block of pages without introducing unnecessary wear to the NAND memory device.

Figure 4:
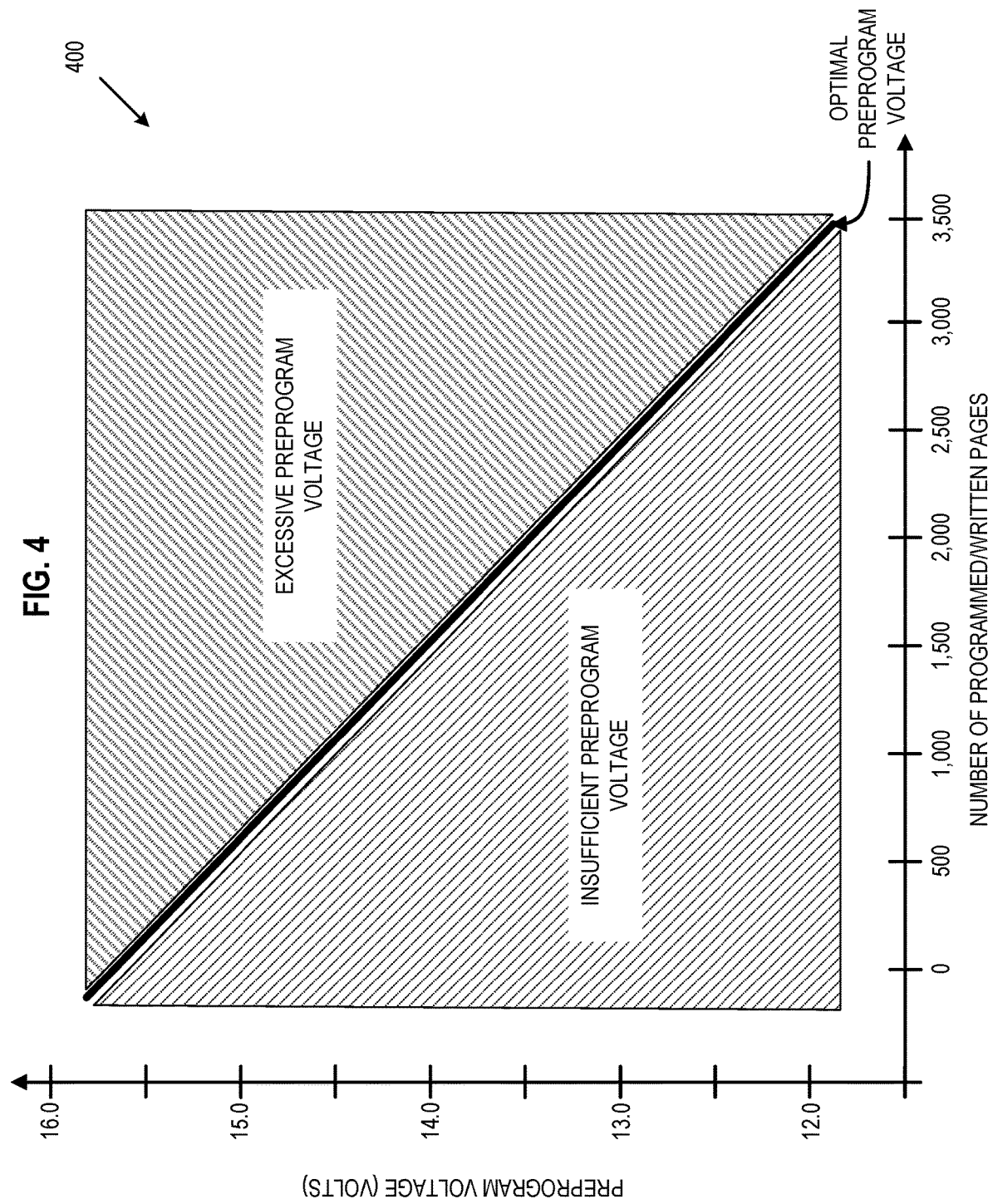
FIG. 4 shows a graph that demonstrates a preprogram voltage in relation to a number of programmed/written pages in a block of pages, in accordance with some embodiments of the present disclosure.

FIG. 4 shows a graph 400 that demonstrates a preprogram voltage in relation to a number of programmed/written pages in a block of pages. Although the graph includes specific values, for a preprogram voltage and a number of programmed/written pages, these values are merely illustrative and other values are possible. As shown in FIG. 4, as the number of programmed/written pages in a block of pages increases, the optimal preprogram voltage necessary to program the block of pages decreases. In particular, the optimal preprogram voltage decreases at a particular ratio ($R_{WP}$) as the number of programmed/written pages in a block of pages increases. As shown, when no pages in the block of pages are programmed, the preprogram voltage can be at the default level of 16 volts. However, the optimal preprogram voltage decreases as the number of programmed/written pages in a block of pages increases until all pages in the block are written (e.g., 3,500 pages are written). At this point, the default preprogram voltage of 16 volts can be decreased by 4 volts to 12 volts. This lower voltage is sufficient to program the block of pages without introducing unnecessary wear to the NAND memory device.

Based on the above, when considering both (1) the number of program and erase operations/cycles and (2) the number of pages programmed/written in the block of pages, the processing device can reduce/trim the default preprogram voltage (e.g., 16 volts) by 5.5 volts (i.e., 1.5 volts based on the number of program and erase operations/cycles and 4 volts based on the number of pages programmed/written in the block of pages). Thus, the processing device can set the preprogram voltage at operation 208 to between 16 volts and 10.5 volts. In some embodiments, the trim value to reduce the default preprogram voltage value can be greater than the example provided herein. For example, the trim value can be up to 6 volts such that the preprogram voltage determined by the processing device is 10 volts.

In one embodiment, the processing device determines the preprogram voltage ($V_{PPGM}$) according to Equation 1 shown below.

$$V_{PPGM} = V_{DEF} - V_{ProgErase} - V_{WP} \quad \text{Equation 1}$$

In the above Equation 1, $V_{DEF}$ is the default preprogram voltage (e.g., 16 volts), $V_{ProgErase}$ is a trim value associated with the number of program and erase operations/cycles (e.g., $V_{ProgErase}$ is between 0 volts and 1.5 volts), and $V_{WP}$ is a trim value associated with the number of pages programmed/written in the block of pages (e.g., $V_{WP}$ is between 0 volts and 4 volts).

In one embodiment, the processing device can determine $V_{ProgErase}$ based on a particular ratio ($R_{ProgErase}$) and a number of program and erase operations/cycles applied to a block of pages ($N_{progErase}$). For example, the processing device can determine $V_{ProgErase}$ according to Equation 2 below.

$$V_{ProgErase} = R_{ProgErase} \times N_{ProgErase} \quad \text{Equation 2}$$

In one embodiment, the processing device can determine $V_{WP}$ based on a particular ratio ($R_{WP}$) and the number of programmed/written pages in a block of pages ($N_{WP}$). For example, the processing device can determine $V_{WP}$ according to Equation 3 below.

$$V_{WP} = R_{WP} \times N_{WP} \quad \text{Equation 3}$$

Based on Equations 1-3, the processing device determines the preprogram voltage ($V_{PPGM}$) according to Equation 4 shown below.

$$V_{PPGM} = V_{DEF} - (R_{ProgErase} \times N_{progErase}) - (R_{WP} \times N_{WP}) \quad \text{Equation 4}$$

The equations shown above are merely examples and used to illustrate the techniques described herein. For example, in some embodiments, Equation 2 can be replaced with a different equation (e.g., power, quadratic, log, etc.).

At operation 210, the processing device applies the preprogram voltage to the block of pages in the NAND memory device. Accordingly, the processing device programs each memory cell/transistor in the block of pages using the preprogram voltage. Since the processing device set the preprogram voltage based on one or more of (1) the number of program and erase operations/cycles and (2) the number of pages programmed/written in the block of pages, each memory cell/transistor is programmed sufficiently without introducing unnecessary wear, which would be caused by a unnecessarily high preprogram voltage level.

At operation 212, the processing device performs an erase operation on the block of pages. In particular, the processing device applies an erase voltage to the block of pages. In one embodiment, the processing device can perform a verify operation following the erase operation to ensure that the erase operation was successful. Following operation 212, the method 200 can return to operation 202 for the next erase operation.

In some embodiments, operations 202, 204, and 206 are performed in the memory subsystem controller 115 (e.g., preprogram voltage component 113). Further, operation 208 can be performed by one or more of the memory subsystem controller 115 in conjunction with the memory device 130 (i.e., a NAND memory device). In particular, the memory subsystem controller 115 (e.g., preprogram voltage component 113) can determine a trim value and transmits this value to the memory device 130 for the memory device 130 to ultimately determine the preprogram voltage (e.g., subtract the trim value from a default preprogram voltage). In some embodiments, operations 210 and 212 can be performed by the memory device 130. Although shown as separate, in one embodiment operation 210 can be part of operation 212. For instance, performance of an erase operation on a block of pages in a NAND memory device can include the processing device applying the preprogram voltage to the block of pages (i.e., operation 210) prior to applying an erase voltage to the block of pages.

As described above, a memory subsystem controller 115 for a NAND memory device can dynamically adjust a preprogram voltage based on one or more factors, including (1) a number of program and erase cycles/operations applied to transistors in the NAND memory device and (2) a last programmed/written page (i.e., a number of programmed/written pages) in the NAND memory device. By dynamically adjusting the preprogram voltage, less stress is applied to the NAND memory device by ensuring that (1) a more conservative preprogram voltage is used while still programming corresponding transistors to avoid a partial block erase condition prior to an erase operation and (2) in cases where blocks of the NAND memory device are nearly entirely written (i.e., the last programmed/written page is a large value), a more conservative preprogram voltage is used.

Figure 5:
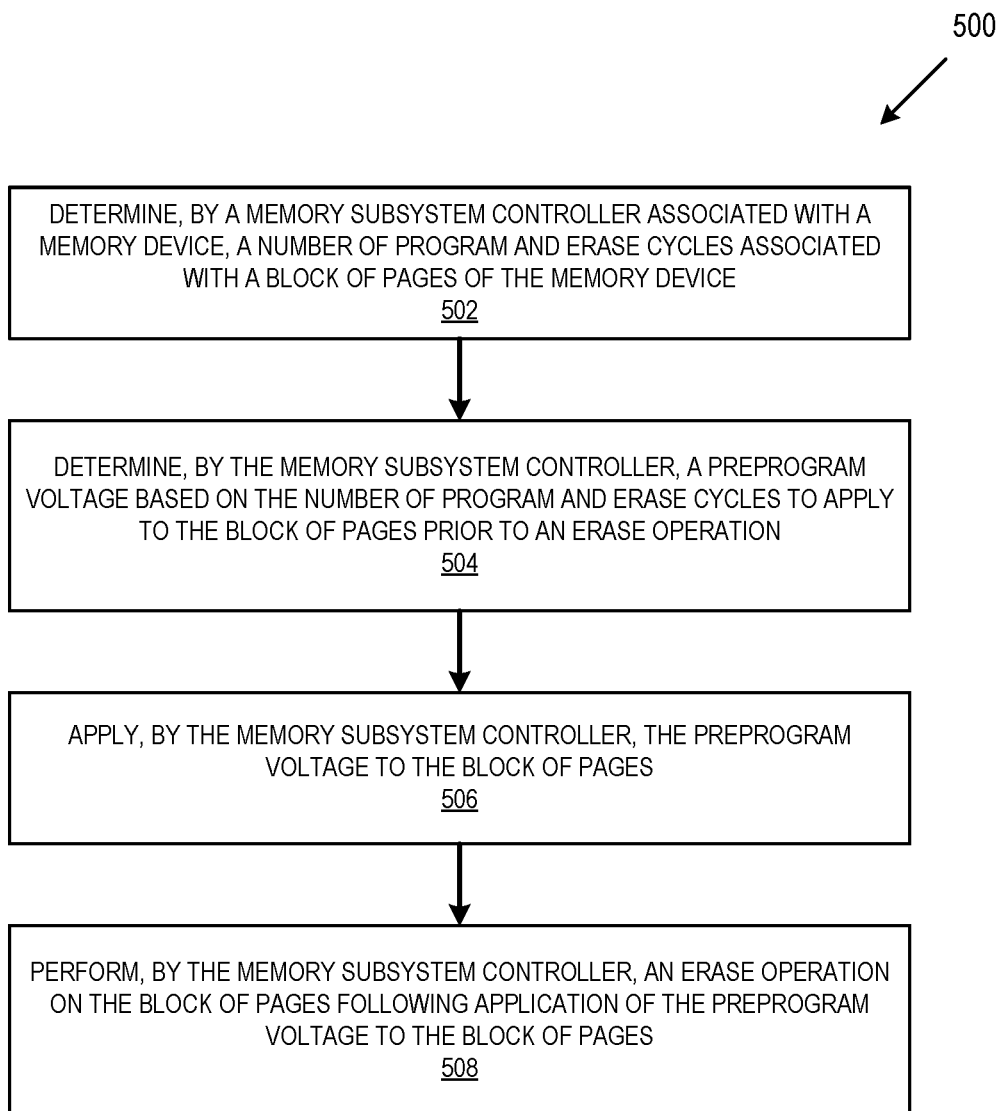
FIG. 5 is a flow diagram of an example method to determine a preprogram voltage for applying to a block of pages in a memory device, in accordance with some other embodiments of the present disclosure.

FIG. 5 is a flow diagram of an example method 500 to determine a preprogram voltage for applying to a block of pages in a memory device (e.g., the memory device 130) based on one or more factors, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the preprogram voltage component 113 of FIG. 1. Although shown in a particular sequence or order, unless otherwise specified, the order of the processes/operations can be modified. Thus, the illustrated embodiments should be understood only as examples, and the illustrated processes/operations can be performed in a different order, and some processes/operations can be performed in parallel. Additionally, one or more processes/operations can be omitted in various embodiments. Thus, not all processes/operations are required in every embodiment. Other process flows are possible.

As shown in FIG. 5, the method 500 commences at operation 502. At operation 502, a processing device determines a number of program and erase cycles associated with a block of pages of a memory device. For example, similar to operation 204 of the method 200, the memory subsystem controller 115 could have previously performed 1,000 program operations and 200 erase operations on a block of pages in the memory device 130. In this example, the processing device determines that 1,200 program and erase cycles have been performed in relation to the block of pages at operation 502. In some systems, an erase operation is required before a program operation can be performed. Accordingly, in these systems 1,000 program operations would result in 1,000 corresponding erase operations. In some embodiments, the processing device can determine that there have been 2,000 program and erase cycles based on this configuration (e.g., 1,000 program operations+1,000 erase operations). In other embodiments, the processing device can determine that there have been 1,000 program and erase cycles based on this configuration (e.g., 1,000 combined program and erase operations).

At operation 504, the processing device determines a preprogram voltage based on the number of program and erase cycles to apply to the block of pages prior to an erase operation. For example, the processing device can determine a preprogram voltage according to the graph 300 of FIG. 3. Namely, for a particular number of program and erase cycles, the graph 300 indicates a preprogram voltage that can be used by the processing device to program memory cells/transistors prior to an erase operation.

At operation 506, the processing device applies the preprogram voltage to the block of pages in the memory device. Accordingly, the processing device programs each memory cell/transistor in the block of pages using the preprogram voltage. Since the processing device set the preprogram voltage based on the number of program and erase operations/cycles, each memory cell/transistor is programmed sufficiently without introducing unnecessary wear, which would be caused by a unnecessarily high preprogram voltage level.

At operation 508, the processing device performs an erase operation on the block of pages. In particular, the processing device applies an erase voltage to the block of pages. In one embodiment, the processing device can perform a verify operation following the erase operation to ensure that the erase operation was successful.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the preprogram voltage component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory subsystem 110 of FIG. 1.

In one embodiment, the instructions 626 include instructions to implement functionality corresponding to a preprogram voltage component (e.g., the preprogram voltage component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200 and 500 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   determining, by a memory subsystem controller associated with a memory device, a first value associated with a number of program and erase cycles associated with a block of pages of the memory device;
   determining, by the memory subsystem controller, a second value associated with a number of pages that have been programmed in the block of pages,
   determining, by the memory subsystem controller, a preprogram voltage by subtracting the first value and the second value from a default preprogram voltage;
   applying, by the memory subsystem controller, the preprogram voltage to the block of pages; and
   performing, by the memory subsystem controller, an erase operation on the block of pages following application of the preprogram voltage to the block of pages.

2. The method of claim 1, wherein as the number of program and erase cycles increases, the first value increases, and wherein as the number of pages that have been programmed in the block of pages increases, the second value increases.

3. The method of claim 1, wherein determining the first value includes multiplying the number of program and erase cycles by a first ratio to generate the first value; and
   wherein determining the second value includes multiplying the number of pages that have been programmed in the block of pages by a second ratio to generate the second value.

4. The method of claim 1, wherein the first value is between 0 and 4 volts and the second value is between 0 and 1.5 volts.

5. The method of claim 1, wherein the memory device is a negative-and (NAND) memory device.

6. A non-transitory computer-readable storage medium comprising instructions that, when executed by a processing device, cause the processing device to:
   determine a first trim value associated with a number of program and erase cycles associated with a block of pages of a memory device;
   determine a second trim value associated with a number of pages that have been programmed in the block of pages;
   determine a preprogram voltage by subtracting the first value and the second value from a default preprogram voltage;
   apply the preprogram voltage to the block of pages; and
   perform an erase operation on the block of pages following application of the preprogram voltage to the block of pages.

7. The non-transitory computer-readable storage medium of claim 6, wherein as the number of program and erase cycles increases, the first trim value increases, and wherein as the number of pages that have been programmed in the block of pages increases, the second trim value increases.

8. The non-transitory computer-readable storage medium of claim 6, wherein determining the first trim value includes multiplying the number of program and erase cycles by a first ratio to generate the first trim value; and wherein determining the second trim value includes multiplying the number of pages that have been programmed in the block of pages by a second ratio to generate the second trim value.

9. The non-transitory computer-readable storage medium of claim 6, wherein the first trim value is between 0 and 4 volts and the second trim value is between 0 and 1.5 volts.

10. The non-transitory computer-readable storage medium of claim 6, wherein the memory device is a negative-and (NAND) memory device.

11. A system comprising:
a memory device; and
a processing device, operatively coupled with the memory device, to:
determine a number of pages that have been programmed in a block of pages of the memory device,
determine a number of program and erase cycles associated with the block of pages,
determine a preprogram voltage based on a difference between the preprogram voltage and a first trim value associated with the number of program and erase cycles and a second trim value associated with the number of pages that have been programmed in the block of pages the,
apply by a memory subsystem controller, the preprogram voltage to the block of pages,
perform, by the memory subsystem controller, an erase operation on the block of pages following application of the preprogram voltage to the block of pages.

12. The system of claim 11, wherein as the number of program and erase cycles increases, the first trim value increases, and wherein as the number of pages that have been programmed in the block of pages increases, the second trim value increases.

13. The system of claim 11, wherein determining the first trim value includes multiplying the number of program and erase cycles by a first ratio to generate the first trim value; and wherein determining the second trim value includes multiplying the number of pages that have been programmed in the block of pages by a second ratio to generate the second trim value.

14. The system of claim 11, wherein the first trim value is between 0 and 4 volts and the second trim value is between 0 and 1.5 volts.

* * * * *